(12) United States Patent
Reinke

(10) Patent No.: US 10,859,596 B2
(45) Date of Patent: Dec. 8, 2020

(54) MECHANICALLY-ISOLATED IN-PLANE PENDULOUS VIBRATING BEAM ACCELEROMETER

(71) Applicant: Honeywell International Inc., Morris Plains, NJ (US)

(72) Inventor: John Reinke, Plymouth, MN (US)

(73) Assignee: Honeywell International Inc., Charlotte, NC (US)

( * ) Notice: Subject to any disclaimer, the term of this patent is extended or adjusted under 35 U.S.C. 154(b) by 192 days.

(21) Appl. No.: 16/041,244

(22) Filed: Jul. 20, 2018

(65) Prior Publication Data
US 2020/0025792 A1   Jan. 23, 2020

(51) Int. Cl.
| | | |
|---|---|---|
| *G01P 15/097* | (2006.01) | |
| *H01L 41/08* | (2006.01) | |
| *B81B 7/00* | (2006.01) | |
| *H03H 9/02* | (2006.01) | |
| *H03H 9/24* | (2006.01) | |

(52) U.S. Cl.
CPC ............ *G01P 15/097* (2013.01); *B81B 7/007* (2013.01); *H01L 41/08* (2013.01); *B81B 2201/0235* (2013.01); *H03H 9/02259* (2013.01); *H03H 9/2473* (2013.01)

(58) Field of Classification Search
CPC ............... G01P 15/097; G01P 15/0888; G01P 15/0802; G01P 15/18; G01P 2015/0808; G01P 2015/0814; G01P 2015/0817; G01P 2015/0828; G01P 2015/0834
See application file for complete search history.

(56) References Cited

U.S. PATENT DOCUMENTS

| | | |
|---|---|---|
| 3,998,106 A | 12/1976 | William |
| 4,766,768 A | 8/1988 | Norling et al. |
| 4,881,408 A * | 11/1989 | Hulsing, II ........... G01P 15/097 73/514.12 |
| 4,912,990 A | 4/1990 | Norling |

(Continued)

FOREIGN PATENT DOCUMENTS

WO   1996028735 A1   9/1996

OTHER PUBLICATIONS

Seshia, et al., "A Vacuum Packaged Surface Micromachined Resonant Accelerometer," Journal of Microelectromechanical Systems, vol. 11, No. 6, Dec. 2002, pp. 784-793.

*Primary Examiner* — Helen C Kwok
(74) *Attorney, Agent, or Firm* — Shumaker & Sieffert, P.A.

(57) ABSTRACT

A vibrating beam accelerometer (VBA) with an in-plane pendulous proof mass, which may include one or more resonators, planar geometry, a single primary mechanical anchor between the support base and the VBA, a resonator connector structure connecting the resonators to the single primary anchor and a hinge flexure mechanically connecting the proof mass to the single primary anchor. The techniques of this disclosure specify how the resonators can be solidly attached to the single anchor without compromising performance caused by forces applied on or by the support base. The geometry of the VBA may prevent bias errors that may otherwise result from a force applied to the support base that reaches the mechanism of the VBA. An example of force applied to the support base, may include the thermal expansion mismatch between the material of the support base and the material of the VBA.

18 Claims, 8 Drawing Sheets

(56) References Cited

U.S. PATENT DOCUMENTS

| | | | |
|---|---|---|---|
| 4,928,203 A | 5/1990 | Swindal et al. | |
| 4,944,184 A * | 7/1990 | Blake | G01P 15/125 |
| | | | 73/514.23 |
| 5,176,031 A | 1/1993 | Peters | |
| 5,501,103 A | 3/1996 | Woodruff et al. | |
| 5,969,249 A * | 10/1999 | Roessig | G01P 15/0802 |
| | | | 73/514.15 |
| 6,257,060 B1 | 7/2001 | Leonardson et al. | |
| 6,662,658 B2 * | 12/2003 | Foote | B81B 3/0051 |
| | | | 73/514.29 |
| 6,874,363 B1 * | 4/2005 | Foote | G01P 15/097 |
| | | | 73/514.29 |
| 6,991,957 B2 | 1/2006 | Eskridge | |
| 7,069,784 B1 | 7/2006 | Eskridge | |
| 7,146,856 B2 | 12/2006 | Malametz | |
| 7,467,553 B2 | 12/2008 | Meyer | |
| 7,980,115 B2 | 7/2011 | Stewart et al. | |
| 8,117,917 B2 | 2/2012 | Novack | |
| 8,497,672 B2 | 7/2013 | Kawakubo et al. | |
| 9,551,576 B2 | 1/2017 | Thiruvenkatanathan et al. | |
| 9,689,888 B2 | 6/2017 | Becka | |
| 2001/0020726 A1 * | 9/2001 | Peterson | G01P 15/0802 |
| | | | 257/415 |
| 2005/0160816 A1 * | 7/2005 | Yu | B81C 3/002 |
| | | | 73/514.29 |
| 2008/0229566 A1 * | 9/2008 | Saito | G01P 15/0802 |
| | | | 29/25.35 |
| 2011/0234206 A1 * | 9/2011 | Kawakubo | G01P 15/0888 |
| | | | 324/162 |
| 2011/0239440 A1 * | 10/2011 | Starzynski | G01P 15/097 |
| | | | 29/592.1 |
| 2012/0067124 A1 * | 3/2012 | Zolfagharkhani | G01C 19/5733 |
| | | | 73/579 |
| 2014/0183669 A1 * | 7/2014 | Xu | G01C 19/5656 |
| | | | 257/415 |
| 2015/0309069 A1 * | 10/2015 | Boillot | B81B 3/0051 |
| | | | 73/514.38 |
| 2016/0139170 A1 * | 5/2016 | Dwyer | G01L 1/22 |
| | | | 73/514.29 |
| 2016/0139171 A1 * | 5/2016 | Becka | G01P 15/032 |
| | | | 73/514.29 |
| 2016/0349283 A1 * | 12/2016 | Bramhavar | G01P 15/097 |
| 2020/0025790 A1 * | 1/2020 | Reinke | G01L 1/162 |

* cited by examiner

MECHANICALLY-ISOLATED IN-PLANE PENDULOUS VIBRATING BEAM ACCELEROMETER

STATEMENT REGARDING FEDERALLY SPONSORED RESEARCH OR DEVELOPMENT

This invention was made with Government support under Government Contract # HR0011-16-9-0001 awarded by DARPA. The Government has certain rights in the invention.

TECHNICAL FIELD

The disclosure relates to vibrating beam accelerometers.

BACKGROUND

Accelerometers function by detecting a displacement of a proof mass under inertial forces. In one example, an accelerometer may detect the displacement of a proof mass by the change in frequency of a resonator connected between the proof mass and a support base. A resonator, which may be designed to change frequency proportional to the load applied to the resonator by the proof mass under acceleration. The resonator may be electrically coupled to an oscillator, or other signal generation circuit, which causes the resonator to vibrate at its resonant frequency.

SUMMARY

In general, the disclosure is directed to a vibrating beam accelerometer (VBA) with an in-plane pendulous proof mass. For example, a VBA configured in accordance with the techniques of this disclosure may include at least one or more resonators, planar geometry, a single primary mechanical anchor between the support base and the VBA, a resonator connector structure connecting the resonators to the single primary anchor and a hinge flexure mechanically connecting the proof mass to the single primary anchor. The techniques of this disclosure specify how the resonators can be solidly attached to the single anchor without compromising performance caused by forces applied on or by the support base.

In some examples, the VBA of this disclosure may be built according to a micro-electromechanical systems (MEMS) fabrication process. The geometry of the pendulous proof mass VBA of this disclosure may prevent bias errors that may otherwise result from a force applied to the support base that reaches the mechanism of the VBA. An example of force applied to the support base, may include the thermal expansion mismatch between the material of the support base and the material of the VBA. The geometry achieves mitigation of forces external to the mechanism by connecting the resonators to a resonator connection structure. The resonator connection structure is a rigid structure that branches back to the primary mechanical anchor, which is mechanically connected to the support base. The resonator connection structure is sized to have a greater stiffness than the axial spring constant of the resonators. This resonator connection structure effectively supports the resonators in the in-plane (e.g. x and y) directions but allows the mechanical connections to thermally expand at a different rate and/or direction of the support base without being restrained by the support base. Fixing one end of the resonators directly to the support base may result in thermal expansion of the support base pulling directly on the resonators, which may cause unacceptable amounts of bias variation over temperature.

In one example, the disclosure is directed to a device comprising: a pendulous proof mass; a support base defining a first plane; a resonator connection structure (16) mechanically connected to the support base with an anchor, wherein the resonator connection structure is in a second plane parallel to the first plane; a hinge flexure configured to flexibly connect the pendulous proof mass to the resonator connection structure, wherein the hinge flexure suspends the pendulous proof mass parallel to the support base at the anchor, and wherein the pendulous proof mass rotates about the hinge flexure in the second plane in response to an acceleration of the device parallel to the first plane of the support base. The device includes at least two resonators configured to flexibly connect the pendulous proof mass to the resonator connection structure and to flex in the second plane based on a rotation of the pendulous proof mass about the hinge flexure, wherein each of the at least two resonators resonate at a respective resonant frequency, wherein the pendulous proof mass, the hinge flexure, and the at least two resonators are in the second plane.

In another example, the disclosure is directed to a system comprising: a pendulous mass vibrating beam accelerometer (VBA), comprising: a pendulous proof mass; a support base defining a first plane; a resonator connection structure (16) mechanically connected to the support base with an anchor, wherein the resonator connection structure is in a second plane parallel to the first plane; a hinge flexure configured to flexibly connect the pendulous proof mass to the resonator connection structure, wherein the hinge flexure suspends the pendulous proof mass parallel to the support base at the anchor, and wherein the pendulous proof mass rotates about the hinge flexure in the second plane in response to an acceleration of the device parallel to the first plane of the support base. The device includes at least two resonators configured to flexibly connect the pendulous proof mass to the resonator connection structure and to flex in the second plane based on a rotation of the pendulous proof mass about the hinge flexure, wherein each of the at least two resonators resonate at a respective resonant frequency, wherein the pendulous proof mass, the hinge flexure, and the at least two resonators are in the second plane. The system further includes a signal generation circuit, e.g. a resonator driver circuit operatively connected to the pendulous mass VBA, and processing circuitry operatively connected to the pendulous mass VBA and the signal generation circuit, wherein: the signal generation circuit is configured to output a first signal that causes the one or more resonators of the pendulous mass VBA to vibrate at a respective resonant frequency of each of the resonators, an acceleration of the pendulous mass VBA in a direction substantially parallel to the second plane causes a rotation of the pendulous proof mass about the hinge flexure parallel to the second plane, the one or more resonators are configured to receive a force, in response to the rotation of the pendulous proof mass, such that the force causes a respective change in resonant frequency of at least one resonator of the one or more resonators, and the processing circuitry is configured to receive a second signal from the pendulous mass VBA indicative of a respective change in the resonant frequency and based on the respective change in resonant frequency, determine an acceleration measurement.

In another example, the disclosure is directed to a method comprising: maintaining, by a plurality of electrodes, resonance of at least two resonators of a pendulous mass vibrating beam accelerometer (VBA), wherein the pendulous mass VBA comprises: a pendulous proof mass; a support base defining a first plane; a resonator connection structure (16) mechanically connected to the support base with an anchor, wherein the resonator connection structure is in a second plane parallel to the first plane; a hinge flexure configured to flexibly connect the pendulous proof mass to the resonator connection structure, wherein the hinge flexure suspends the pendulous proof mass parallel to the support base at the anchor, and wherein the pendulous proof mass rotates about the hinge flexure in the second plane in response to an acceleration of the device parallel to the first plane of the support base. The device includes at least two resonators configured to flexibly connect the pendulous proof mass to the resonator connection structure and to flex in the second plane based on a rotation of the pendulous proof mass about the hinge flexure, wherein each of the at least two resonators resonate at a respective resonant frequency, wherein the pendulous proof mass, the hinge flexure, and the at least two resonators are in the second plane. The method further comprises receiving, by a first resonator of the at least two resonators, in response to an acceleration of the pendulous mass VBA substantially parallel to the second plane and upon rotation of a pendulous proof mass in the second plane about a hinge flexure, a first force; receiving, by a second resonator of the at least two resonators, in response to the acceleration of the pendulous mass VBA substantially parallel to the second plane and upon rotation of the pendulous proof mass in the second plane about the hinge flexure, a second force; detecting, by the plurality of electrodes, respective signals that are indicative of a respective change in the resonant frequency of each of the first and second resonators caused by the first force and the second force; and outputting, by the pendulous mass VBA, the respective signals.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
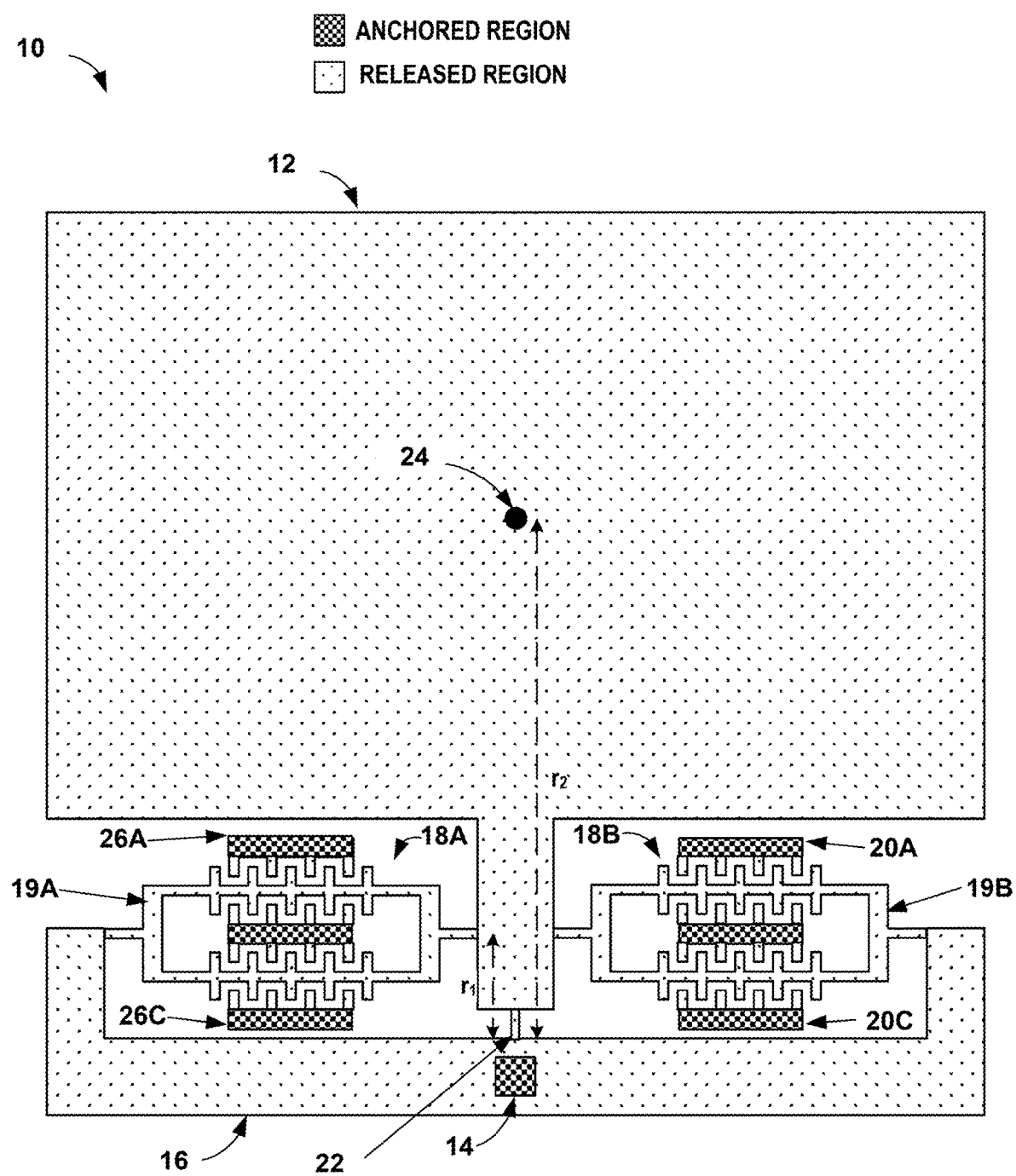
FIG. 1 is a conceptual diagram illustrating a pendulous VBA without supporting flexures and with X-direction resonators.
Figure 1:
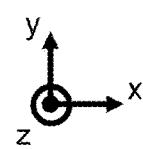

The disclosure is directed to a vibrating beam accelerometer (VBA) with an in-plane pendulous proof mass. For example, a VBA configured in accordance with the techniques of this disclosure may include at least one or more resonators, planar geometry, a single primary mechanical anchor between the support base and the VBA, a resonator connector structure connecting the resonators to the single primary anchor and a hinge flexure mechanically connecting the proof mass to the single primary anchor. The techniques of this disclosure specify how the resonators can be solidly attached to the single anchor without compromising performance caused by forces applied on or by the substrate.

An accelerometer measures acceleration of the accelerometer device itself with respect to an inertial reference frame. Some examples of VBAs may be manufactured using macro methods and may sense only out-of-plane displacement of the proof mass. VBAs using macro methods may be relatively expensive to produce and possess numerous mechanical joints between parts that may lead to performance limitations. In other examples, VBAs manufactured using micro-electromechanical systems (MEMS) manufacturing techniques, may sense out-of-plane displacement the proof mass, and may require complex attachment of the resonant sensors to obtain leveraged amplification of the proof mass. The pendulous VBA of this disclosure may have advantages in being less complex and in some examples may have improved performance over other types of VBA, such as improved bias repeatability with changes in operating conditions.

The pendulous proof mass VBA of this disclosure is configured to sense in-plane displacement of the proof mass. The techniques of this disclosure recognize that in-plane type MEMS VBA may have good scale factor stability but may lack bias stability, or stated more accurately bias repeatability. The bias for an accelerometer is the offset or bias when the accelerometer is not subject to acceleration. This bias may change over different operating conditions, e.g. changes in temperature, or as the accelerometer ages. The techniques of this disclosure may result in improved bias repeatability for an accelerometer over time and changing operating conditions when compared to other techniques. Bias repeatability may be equally valuable as scale factor stability for navigation-grade performance VBAs.

The geometry of the pendulous proof mass VBA of this disclosure may prevent bias errors that may otherwise result from a force applied to the support base that reaches the mechanism of the VBA. Forces applied to the support base may come from external mechanical forces applied to the circuit board, package, and/or substrate that contains the accelerometer mechanism. The source of external forces may be unavoidable, for example, thermal expansion mismatch between the substrate (e.g. the support base) and the VBA mechanism.

The geometry achieves mitigation of forces external to the mechanism by connecting the resonators to a rigid structure, which branches back to the primary mechanical anchor to the support base. The resonator connection structure is sized to be stiffer than the axial spring constant of the resonators. This connection effectively supports the resonators in the in-plane (e.g. x and y) directions but allows the mechanical connections of the VBA to thermally expand at a different rate and/or direction of the support base without being restrained by the support base. Fixing one end of the resonators directly to the support base may result in thermal expansion of the support base pulling directly on the resonators, which may cause unacceptable amounts of bias variation over temperature. Some example VBA configurations of this disclosure may also include supporting flexures to stiffen the structure in the out-of-plane (z) direction. These supporting flexures are designed to be substantially more flexible in the in-plane (x and y) directions.

Some example applications of the in-plane pendulous proof mass VBA of this disclosure may include navigation-grade MEMS accelerometer used in navigation-grade inertial measurement units (IMU's). An IMU may be used, for example in aircraft or water borne vessels that may be subject to wind and current in addition to the forces from a propulsion unit and steering mechanisms, e.g. a rudder. An IMU that includes a VBA according to this disclosure may have an advantage of improved performance and reduced size and cost when compared to other techniques of building an IMU.

FIG. 1 is a conceptual diagram illustrating a pendulous VBA without supporting flexures and with X-direction resonators. FIG. 1 is a top view of VBA 10 showing the anchor 14 to the support base, but the support base is not shown.

VBA 10 includes pendulous proof mass 12 connected to a rigid resonator connection structure 16 at hinge flexure 22, and resonators 18A and 18B. For a pendulous VBA according to this disclosure, proof mass 12 may move in a plane parallel to the plane of the support base (not shown in FIG. 1). A support base may be a substrate of, for example, a quartz or silicon wafer. Resonators 18A and 18B of VBA 10 convert the inertial force of proof mass 12 under acceleration, to a change in the driven resonant frequency. The VBA outputs a change in the resonant frequency of each resonator as an indication of the amount of acceleration. In some examples, the resonators may be located adjacent to the proof mass so that the resonators receive the proof mass force amplified through lever action.

In the example of a MEMS VBA, VBA 10 may be fabricated from a dissolved wafer process that produces VBA 10 as a silicon mechanical structure tethered to lower and upper glass substrates (not shown in FIG. 1) at specific anchor regions, e.g. anchor 14. The glass substrates may be etched in other areas to define released regions of VBA 10, which include air gaps that allow the silicon portions, such as proof mass 12, to move freely relative to the substrate. Areas which are not etched are bonded to silicon to define mechanical anchors. The geometry of both the silicon mechanism and anchor regions may be defined by photolithography.

A dissolved wafer process to fabricate a silicon VBA and glass substrates is just one example of a technique to fabricate a VBA of this disclosure. Other techniques may be used to fabricate the geometry of VBA 10. Some other examples may include materials such as quartz (SiO2), piezoelectric material and similar materials. Other processes may include isotropic etching, chemical etching, deep reactive-ion etching (DRIE) and similar processes. In the example of FIG. 1, proof mass 12, resonator connection structure 16, hinge flexure 22, resonators 18A, 18B may be comprised of a monolithic material, which results in the components of VBA 10 all with the same coefficient of thermal expansion (CTE). The components of VBA 10 are all in the same plane, parallel to the X-Y plane as shown in FIG. 1.

Proof mass 12 connects to resonator connection structure 16 at anchor 14 by hinge flexure 22. The point at which hinge flexure 22 connects to anchor 14 is the center of rotation for proof mass 12. Left and right resonators 18A and 18B connect to the same primary anchor 14 by rigid resonator connection structure 16. Resonators 18A and 18B connect to proof mass 12 at a distance r1 from the center of rotation for proof mass 12. Center of mass 24 for proof mass 12 is at a distance r2 from the center of rotation for proof mass 12. This results in the inertial force of proof mass 12 amplified by the leverage ratio r2/r1.

In other words, hinge flexure 22 may be configured to flexibly connect proof mass 12 to the resonator connection structure 16. Hinge flexure 22 suspends proof mass 12 parallel to the support base (not shown in FIG. 1) at anchor 14. In response to an acceleration of VBA 10, proof mass 12 rotates about the hinge flexure 22 in its plane, parallel to the X-Y plane and parallel to the plane of the support base (not shown in FIG. 1). The support base of this disclosure may be formed from the substrate using the etching processes described above.

Resonators 18A and 18B, in the example of FIG. 1, include anchored combs and resonator beams with released combs. Resonator 18A includes resonator beam 19A with released combs and anchored combs 26A-26C and resonator 18B includes resonator beam 19B released combs and anchored combs 20A-20C. In some examples, anchored combs may be referred to as stator combs. Resonators 18A and 18B are configured to flexibly connect the pendulous proof mass 12 to resonator connection structure 16 with resonator beams 19A and 19B and to flex within the plane of proof mass 12 based on the rotation of the proof mass 12 about hinge flexure 22.

Each of the two resonators 18A and 18B resonate at a respective resonant frequency, which, in some examples may be approximately the same frequency. VBA 10 includes metal layers deposited onto the glass substrates (not shown in FIG. 1). These metal layers define electrical wires that connect silicon electrodes to bond pads. The bond pads may be external to VBA 10 and used to electrically connect to external circuitry that excites and sustains mechanical motion at the resonant frequency for each resonator 18A and 18B through electrostatic actuation, e.g. by applying an electric charge. In the presence of external acceleration, proof mass 12 will deflect and apply axial force to resonator beams 19A and 19B of resonators 18A and 18B. This axial force from proof mass 12 causes a change in the driven resonant frequency such that the frequency change may be used to measure external acceleration on VBA 10.

The tines of the released combs on resonator beams 19A-19B and anchored combs 20A-20C and 26A-26C may enable the detection the change in resonant frequency, which may be translated as an amount of force (e.g., increase or decrease of force) and further translated as the amount of acceleration on VBA 10. For example, during calibration, the change in frequency may be mapped to a force on the resonator beam, which may be further mapped to an amount of acceleration on VBA 10. In the example of FIG. 1, the two resonators 18A and 18B allow for a differential frequency measurement results from change in frequency when a force (e.g., compression or tension) is placed on the two resonator beams 19A-19B by rotation of proof mass 12.

The differential frequency measurement output by the sense signals from VBA 10 is used to reject sources of error common to both resonators. One example may include a temperature change. That is, a change in operating condition, such as a temperature change may affect both resonators the same way. A second example would be any shift in voltages applied to both resonators. A differential frequency measurement may subtract sources of common error applied to both resonators by subtracting the common error and leaving approximately just the signal caused by acceleration on VBA 10. The differential frequency measurement may then ultimately lead to improved bias repeatability for the accelerometer.

In some examples, the resonators may have a different resonant frequency, for example, resonator 18A may be configured to resonate at a different frequency than resonator 18B. In some examples, the mass of one resonator may be configured to be different from one or more other resonators. A VBA with resonators that have a different resonant frequency may provide a benefit, for example, when the VBA is at zero g, i.e. essentially no acceleration experienced by the VBA, the resonators may not vibrate at exactly the same frequency. The different frequency at zero g causes an intentional offset in the VBA and may result in improved detectability and performance.

In the example of FIG. 1, two resonators are used to provide a differential frequency measurement. In other examples, the techniques of this disclosure may also apply to VBA's with more or fewer resonators. In other examples, the one or more resonators may be oriented at any angle, not just x and y while still using the techniques of this disclosure. Though shown as double-ended tuning fork (DETF) comb resonators in the example of FIG. 1, in other examples, resonators 18A and 18B may be configured as other types of resonators. For example, instead of DETF, resonators 18A and 18B may be single resonator beam or a more complex resonator geometry. Also, resonator beams 19A and 1B may comprise a piezoelectric material and may not include comb tines.

In the example of VBA 10, resonators 18A-18B are configured to flex in a direction substantially parallel to a long axis of the resonator connection structure 16. The long axis of resonator connection structure 16 is parallel to the X-axis in the example of FIG. 1. Resonators 18A-18B are oriented along the X-axis in the example of VBA 10. In this disclosure, substantially parallel means structures or planes are parallel within manufacturing and measurement tolerances.

Resonator connection structure 16 connects resonators 18A-18B to primary anchor 14 through a sufficiently rigid connection that allows proof mass 12 to exert axial force on the resonator beams. Resonator connection structure 16 is sized to be stiffer than the axial spring constant of the resonators. The geometry of resonator connection structure 16 and resonators 18A-18B, according to the techniques of this disclosure, configure proof mass 12, resonator beams 19A-19B and resonator connection structure 16 to be connected to the support base by the single region at anchor 14. Resonator connection structure 16 may reduce or prevent bias errors that may otherwise result from the thermal expansion mismatch between the glass substrate (support base) and the silicon mechanism (e.g. pendulous proof mass 12). In other words, the design of the silicon and glass masks are such that both the proof mass 12 and resonators 18A-18B are primarily anchored to a single region, e.g. at anchor 14.

An advantage of the geometry of a VBA of this disclosure may include to reducing or preventing thermal expansion mismatch, as well as other forces exerted on the substrate from reaching resonators 18A-18B and significantly straining the resonator beams. The geometry of this disclosure may have an advantage of ultimately providing a more precise measurement of external acceleration when compared to a VBA with different geometry. In other words, anchor 14 may be configured to allow a first thermal expansion of the support base, and a second thermal expansion of the monolithic material of resonators 18A-18B and resonator connection structure 16, in examples in which the first thermal expansion is different than the second thermal expansion. The geometry of resonator connection structure 16 is configured to substantially prevent other forces applied to the support base from transferring to either the pendulous proof mass 12 or the at least two resonators. Some examples of other forces may include forces applied to VBA 10 by the circuit board, or other structure, on which VBA 10 is mounted. The circuit board may be subjected to forces, such as squeezing or twisting that may be transferred to the components on the circuit board, including VBA 10.

Figure 2A:
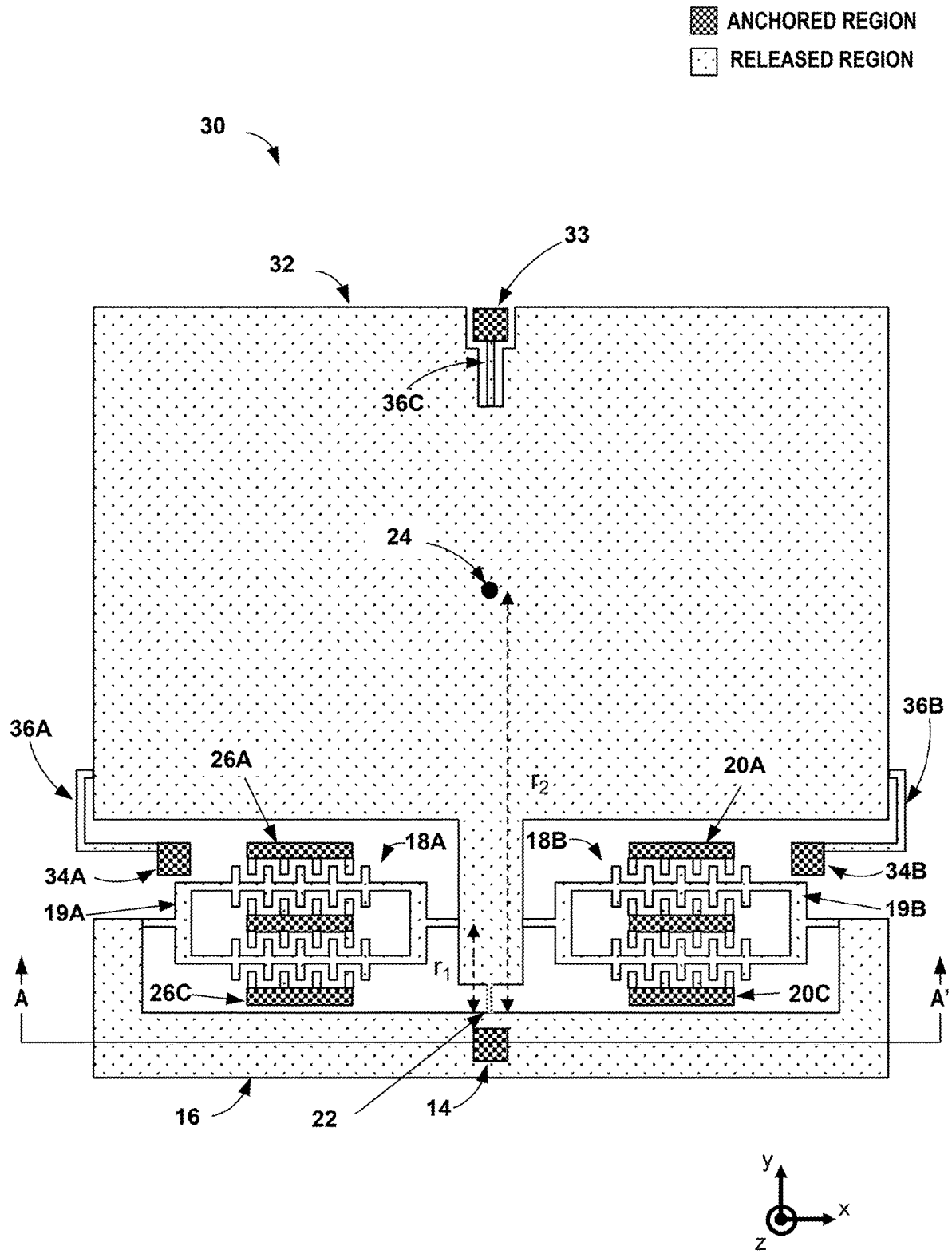
FIG. 2A is a conceptual diagram illustrating a pendulous VBA with supporting flexures and with X-direction resonators.

FIG. 2A is a conceptual diagram illustrating a pendulous VBA with supporting flexures and with X-direction resonators. Similar to FIG. 1, FIG. 2A is a top view of VBA 30 showing the anchor 14 to the support base, but the support base is not shown. VBA 30 includes pendulous proof mass 32 connected to anchor 14 and resonator connection structure 16 at hinge flexure 22, and resonators 18A and 18B. Items in FIG. 2A with the same reference numbers as in FIG. 1 have the same description, properties and function as described above in relation to FIG. 1. FIG. 2A also shows section A-A', which runs along the long axis of resonator connection structure 16 and through anchor 14.

Pendulous proof mass 32 includes supporting flexures, but otherwise the functions and description of proof mass 32 is the same as proof mass 12 described above in relation to FIG. 1. For example, proof mass 32 connects to resonator connection structure 16 at anchor 14 by hinge flexure 22. The point at which hinge flexure 22 connects to anchor 14 is the center of rotation for proof mass 32. Left and right resonators 18A and 18B connect to the same primary anchor 14 by resonator connection structure 16. Resonators 18A and 18B connect to proof mass 32 at a distance r1 from the center of rotation for proof mass 12. Center of mass 24 for proof mass 12 is at a distance r2 from the center of rotation for proof mass 12. As with VBA 10 shown in FIG. 1, this results in the inertial force of proof mass 12 on released beams 19A and 19B amplified by the leverage ratio r2/r1.

Proof mass 32 may include one or more support flexures to stiffen movement of proof mass 32 in the out-of-plane (z) direction. In other words, the support flexures, e.g. flexure 33, coupled to proof mass 32 is configured to restrict out-of-plane motion of the pendulous proof mass with respect to the X-Y plane parallel to the proof mass 32 and resonator connection structure 16. These flexures are configured to be substantially more flexible in the in-plane (x and y) directions than the rigid resonator connection structure or the axial stiffness of the resonators. For example, flexure 33 includes an anchor portion, connected to the support base (not shown in FIG. 2A) similar to the primary anchor 14. Flexure 33 may include a flexible portion 36C connected between the anchor portion 33 and proof mass 32. The flexible portion 36C may be of the same or similar material to that of proof mass 32. The configuration of the one or more support flexures may reduce out of plane movement, while avoiding bias caused by forces applied to the accelerometer mechanism (e.g. proof mass 32 and resonators 18A and 18B) that may be caused by CTE mismatch between the substrate and the accelerometer mechanism.

Proof mass 32 may include additional support flexures, such as the flexures with anchor portions 34A and 34B and flexible portions 36A and 36B. As described above for flexure 33, flexible portions 36A and 36B may be of the same or similar material to proof mass 32. The position of anchor portions 34A and 34B and the shape and configuration of flexible portions 36A and 36B shown in FIG. 2A is just one example technique for providing support flexures to stiffen movement of proof mass 32 in the out-of-plane (z)

direction. In other examples, flexible portions 36A and 36B may have different shapes, such as a straight beam or an S-shape. In other examples, VBA 30 may have more or fewer support flexures. The anchor portions of support flexures of this disclosure will not exert significant forces on proof mass 32, so the mechanism of VBA 30 will still be connected to the structure of the support base primarily by a single anchor region, e.g. anchor 14. As with VBA 10 described above in relation to FIG. 1, advantages of the geometry of VBA 30 include reduced bias errors that may otherwise result from the thermal expansion mismatch between the glass substrate (support base) and the silicon mechanism (e.g. pendulous proof mass 32).

As described above in relation to FIG. 1, use of a single primary mechanical anchor may reduce or prevent bias errors that can be caused by external mechanical forces applied to the circuit board, package, and/or substrate that contains the accelerometer mechanism. Since the source of these forces may be unavoidable (e.g., thermal expansion mismatch between the substrate and mechanism), the geometry of the VBA of this disclosure may mechanically isolate the sensitive components. Another advantage may include reduced cost and complexity, by achieving the mechanical isolation within the MEMS mechanism, which may avoid the need for additional manufacturing steps or components, such as discrete isolation stages.

Figure 2B:
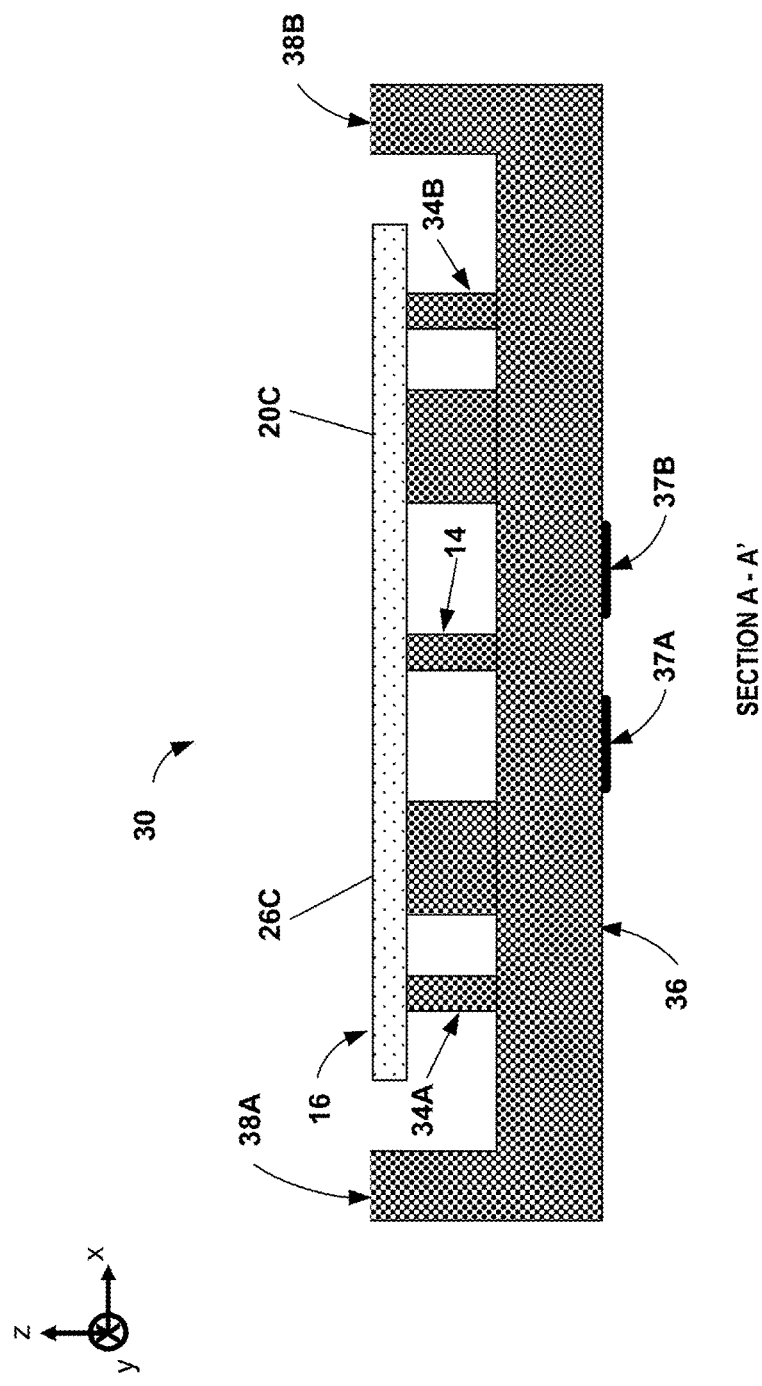
FIG. 2B is a conceptual diagram illustrating a sectional view of a pendulous VBA with supporting flexures and with X-direction resonators.

FIG. 2B is a conceptual diagram illustrating a sectional view of a pendulous VBA with supporting flexures and with X-direction resonators. FIG. 2B shows section A-A', which runs down the long axis of resonator connection structure 16 and through anchor 14. Items in FIG. 2B with the same reference numbers as in FIGS. 1 and 2A have the same description, properties and function as described above. For example, VBA 30 includes pendulous proof mass 32 (not shown in FIG. 2B) connected to resonator connection structure 16 at anchor 14. FIG. 2B also shows the anchor portion of anchored combs 26C and 20C, as well as the anchored portions of the support flexures, 34A and 34B.

As described above in relation to FIG. 1, VBA 30 may be fabricated using silicon and glass masks such that both the proof mass 32 and resonator connection structure 16 are primarily anchored to a single region, e.g. at anchor 14. The released silicon mechanical structure of VBA 30 may be tethered to support base 36, which may be a glass substrate, such as quartz substrate or a silicon substrate. Proof mass 32 may be also tethered at other anchor regions, e.g. anchor portions 34A and 34B, configured to allow the released silicon portions, such as proof mass 32 and the resonator beams 19A and 19B of resonators 18A and 18B (not shown in FIG. 2B) to move freely relative to the support base 36.

Support base 36 may include enclosing structures, such as structures 38A and 38B, which may surround the released portions of VBA 30. In some examples, VBA 30 may include both lower support base 36 and an upper support (not shown in FIG. 2B). In some examples the anchored portions, e.g. anchor 14, may be mechanically connected to both the lower support base 36 and the upper support. Support base 36 may define a second plane, also substantially parallel to the X-Y plane that is different from the plane of the released portions of VBA 30. The plane defined by the released portions of VBA 30 (e.g. resonator beams 19A-19B and proof mass 32) may be substantially parallel to the second plane defined by support base 36. As described above in relation to FIG. 1, air gaps between the plane of the proof mass and the plane of support base 36 may allow the silicon portions, such as the proof mass, to move freely relative to the substrate.

Resonator connection structure 16 may be configured to be more rigid than the resonators. The rigid structure of resonator connection structure 16 connects to the resonators and branches back to the primary mechanical anchor 14, which is connected to support base 36. Resonator connection structure 16, as described above, may be sized to be stiffer than the axial spring constant of the resonators and supports the resonators in the in-plane (e.g. x and y) directions. In some examples, resonator connection structure 16 may be an order of magnitude stiffer than resonator beams 19A-19B. The single primary anchor 14 allows the mechanical connections of the released portions of VBA 30 to thermally expand at a different rate or direction of the support base 36 without being restrained by other connections to support base 36 that may cause bias and inaccuracy.

Support base 36 may include metal layers deposited onto the glass substrates (not shown in FIG. 2B), which define electrical wires that connect silicon electrodes to wire bond pads. In some examples, support base 36 may include bond pads and other metal structures on the bottom surface of support base 36 (e.g. as indicated by the arrow from 36), such as conductive paths 37A and 37B. In some examples, support base 36 may include metal layers on the top surface, e.g. on the surface opposite the bottom surface, and in other examples, support base 36 may include intermediate metal layers between the top and bottom surfaces (not shown in FIG. 2B). In some examples the metal layers may electrically connect to each other with vias, or other types of connections through support base 36. In some examples, electrical wires may also be defined with other conductive material other than metal. As described above in relation to FIG. 1, the metal layers, or other conductive material, may define electrical paths to carry signals to and from VBA 30, such as conductive paths 37A and 37B.

As described above in relation to FIGS. 1 and 2A, each resonator of the one or more resonators may include a resonator beam with released comb (e.g. 19A) and an anchored comb (e.g. 20C and 26C). As shown in FIG. 2B, the anchor portion of anchored combs 20C and 26C extend from the plane of support base 36 to the plane of the released portions of VBA 30. The comb portions of anchored combs 20C and 26C are supported in the same plane as resonator beams 19A-19B and proof mass 12 and 32, described above in relation to FIGS. 1 and 2A.

Figure 3:
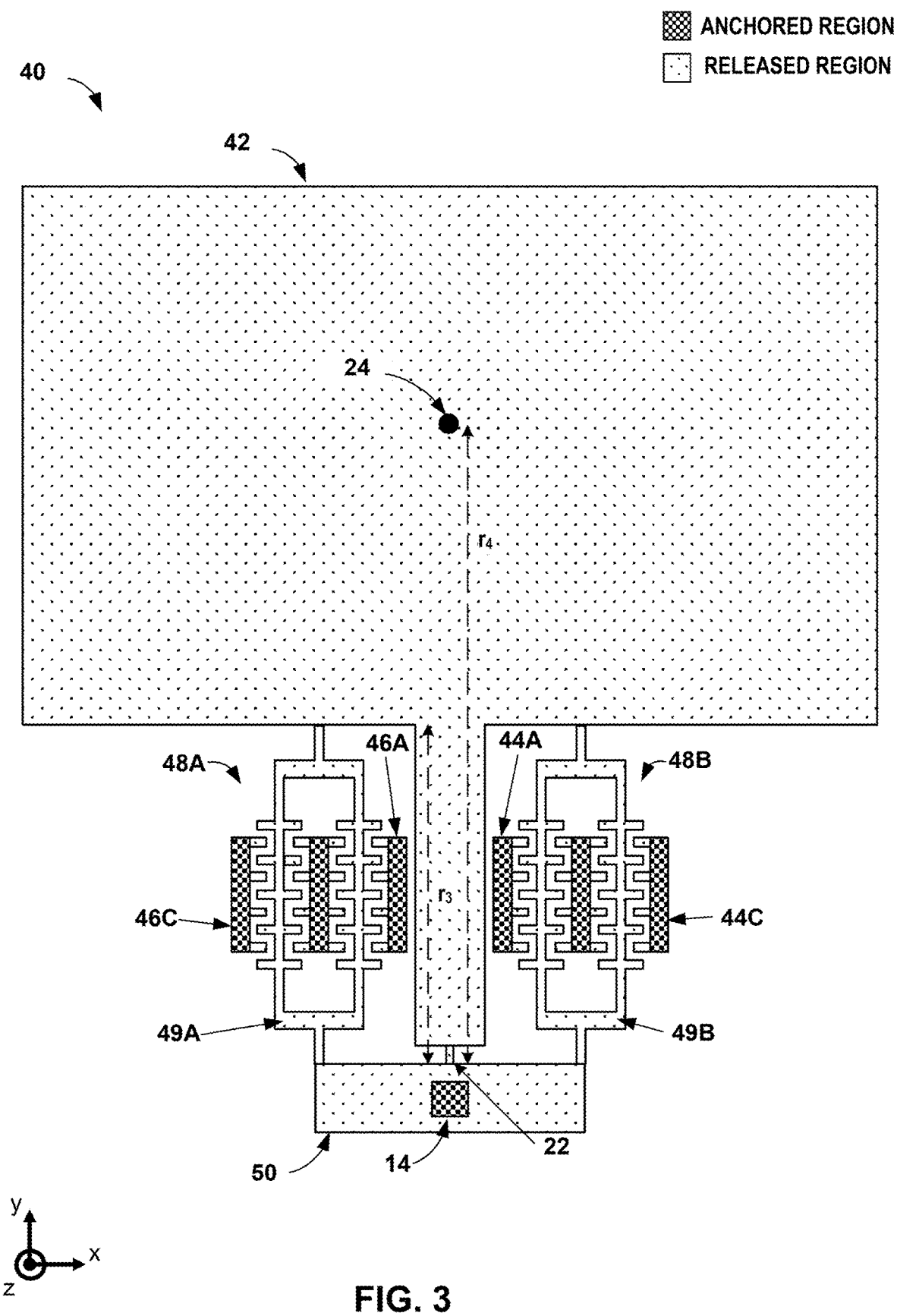
FIG. 3 is a conceptual diagram illustrating a pendulous VBA without supporting flexures and with Y-direction resonators.

FIG. 3 is a conceptual diagram illustrating a pendulous VBA without supporting flexures and with Y-direction resonators. VBA 40 depicted in the example of FIG. 3 includes the similar structure and configuration as well as the same advantages and functions as described above in relation to FIG. 1, except that resonators 48A and 48B are rotated to be oriented in the Y-direction rather than the X-direction. For example, VBA 40 includes pendulous proof mass 42 connected to anchor 14 and resonator connection structure 50 at hinge flexure 22. Items in FIG. 3 with the same reference numbers as in FIG. 1 have the same description, properties and function as described above in relation to FIG. 1.

Similar to proof mass 12 of FIG. 1, the point at which hinge flexure 22 connects to anchor 14 is the center of rotation for proof mass 42. Left and right resonators 48A and 48B connect to primary anchor 14 by resonator connection structure 50. Resonators 48A and 48B connect to proof mass 42 at a distance r3 from the center of rotation for proof mass 42. Center of mass 24 for proof mass 42 is at a distance r4 from the center of rotation for proof mass 42. This results in the inertial force of proof mass 42 amplified by the leverage ratio r4/r3.

In contrast to the example of VBA 10 depicted in FIG. 1, resonators 48A-48B are configured to flex in a direction substantially perpendicular to a long axis of the resonator connection structure 50. As with the example of resonator connection structure 16 shown in FIG. 1, the long axis of resonator connection structure 50 is parallel to the X-axis in the example of FIG. 3.

Like the example of VBA 10 shown in FIG. 1, resonator connection structure 50 connects resonators 48A-48B to primary anchor 14 through a rigid connection that allows proof mass 42 to exert axial force on the resonator beams. Resonator connection structure 50 is sized to be stiffer than the axial spring constant of the resonators. The geometry of resonator connection structure 16 and resonators 18A-18B, according to the techniques of this disclosure, configure proof mass 12, resonator beams 19A-19B and resonator connection structure 16 to be connected to the support base by the single point at anchor 14. As described above, resonator connection structure 50 may reduce or prevent bias errors that may otherwise result from the thermal expansion mismatch between the glass substrate (e.g. support base 36 of FIG. 2B) and the silicon mechanism (e.g. pendulous proof mass 42), as well as from some other force applied to the support base.

As with VBA 10 of FIG. 1, resonators 48A and 48B, include anchored combs and resonator beams with released combs. Resonator 48A includes resonator beams 49A and anchored combs 46A-46C and resonator 48B includes resonator beams 49B and anchored combs 44A-44C. To simplify FIG. 3 for clarity, anchored combs 44B and 46B are not labeled. The axial force from proof mass 42 causes a change in resonant frequency such that the frequency change may be used to measure external acceleration on VBA 40. In the example of FIG. 3, a differential frequency measurement from the right and left resonators results from change in frequency when a force (e.g., compression or tension) is placed on resonator beams 49A-49B by rotation of proof mass 42.

Figure 4A:
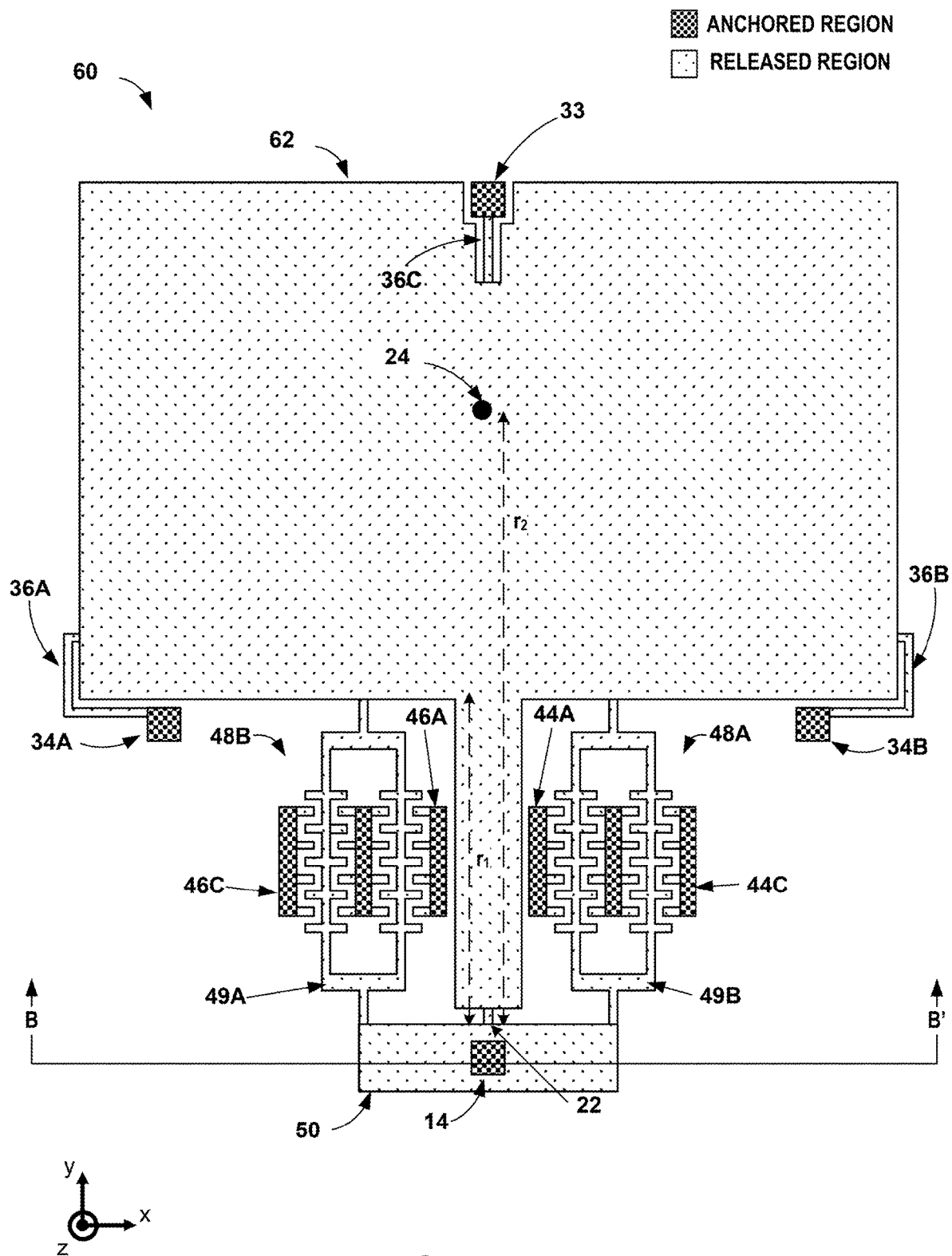
FIG. 4A is a conceptual diagram illustrating a pendulous VBA with supporting flexures and with Y-direction resonators
Figure 4B:
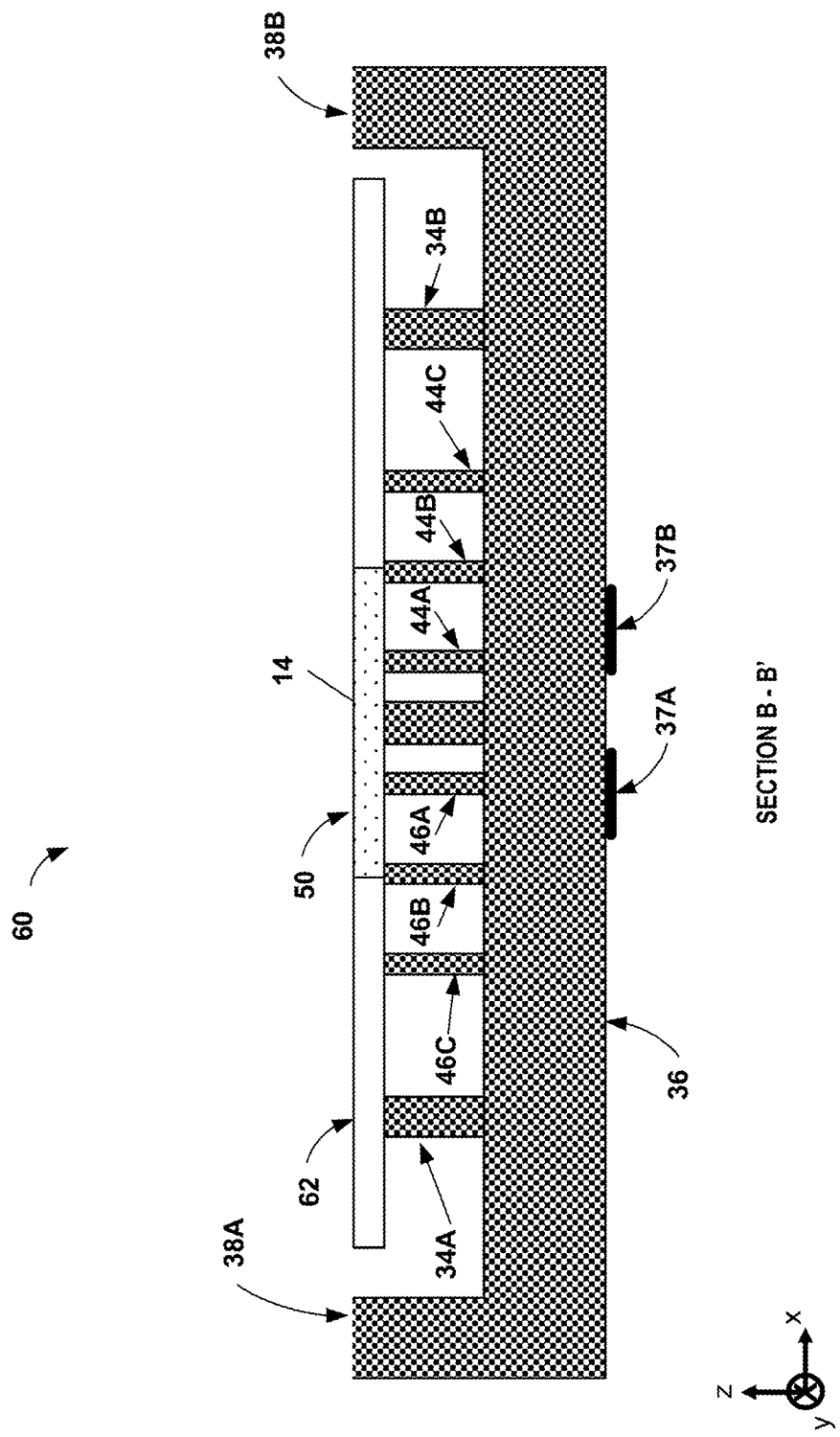
FIG. 4B is a conceptual diagram illustrating a sectional view of a pendulous VBA with supporting flexures and with Y-direction resonators.

FIG. 4A is a conceptual diagram illustrating a pendulous VBA with supporting flexures and with Y-direction resonators. Similar to FIG. 2A and FIG. 3, FIG. 4B is a top view of VBA 60 showing the anchor 14 to the support base, but the support base is not shown. VBA 60 includes pendulous proof mass 62 connected to anchor 14 and resonator connection structure 50 at hinge flexure 22, and resonators 48A and 48B. Items in FIG. 4A with the same reference numbers as in FIGS. 1 and 3 have the same description, properties and function as described above in relation to FIGS. 1 and 3. FIG. 4A also shows section B-B', which runs down the long axis of resonator connection structure 50 and through anchor 14.

As with pendulous proof mass 32 depicted in FIG. 2A, FIG. 4B includes supporting flexures, with the same function and description as described above in relation to FIG. 2A. Flexure 33, along with anchor portions 34A and 34B and flexible portions 36A and 36B. Flexible portions 36A and 36B may be of the same or similar material to proof mass 62 to avoid mismatch in CTE.

FIG. 4B is a conceptual diagram illustrating a sectional view of a pendulous VBA with supporting flexures and with Y-direction resonators. FIG. 4B shows section B-B', which runs down the long axis of resonator connection structure 50 and through anchor 14. Items in FIG. 4A with the same reference numbers as in FIGS. 1, 3 and 4A have the same description, properties and function as described above. For example, VBA 60 includes pendulous proof mass 62 connected to resonator connection structure 50 at anchor 14. FIG. 4B also shows the anchor portion of anchored combs 46A-46C and 44A-44C, as well as the anchored portions of the support flexures, 34A and 34B.

As described above in relation to FIGS. 1 and 2B, VBA 60 may be fabricated using silicon and glass masks such that both the proof mass 62 and resonator connection structure 50 are primarily anchored to a single anchor 14. The silicon mechanical structure of VBA 60 may be tethered to support base 36 at anchor portions 34A and 34B, configured to allow the silicon portions, such as proof mass 32 and the release resonators (not shown in FIG. 2B) to move freely relative to the support base 36 in the X-Y plane but restrict motion in the z-direction.

Support base 36 may include enclosing structures, such as structures 38A and 38B, which may surround the released portions of VBA 60. In some examples, VBA 60 may include both lower support base 36 and an upper support (not shown in FIG. 4B). Similar to FIG. 2B, support base 36 may define a plane substantially parallel to the X-Y plane different from the plane defined by the released portions of VBA 60. Air gaps between the plane of proof mass 62 and the plane of support base 36 may allow the silicon portions, such as proof mass 62, to move freely relative to support base 36. Support base 36 may also include the metal layers, or other conductive material, that define electrical paths to carry signals to and from VBA 60, such as conductive paths 37A and 37B.

Figure 5:
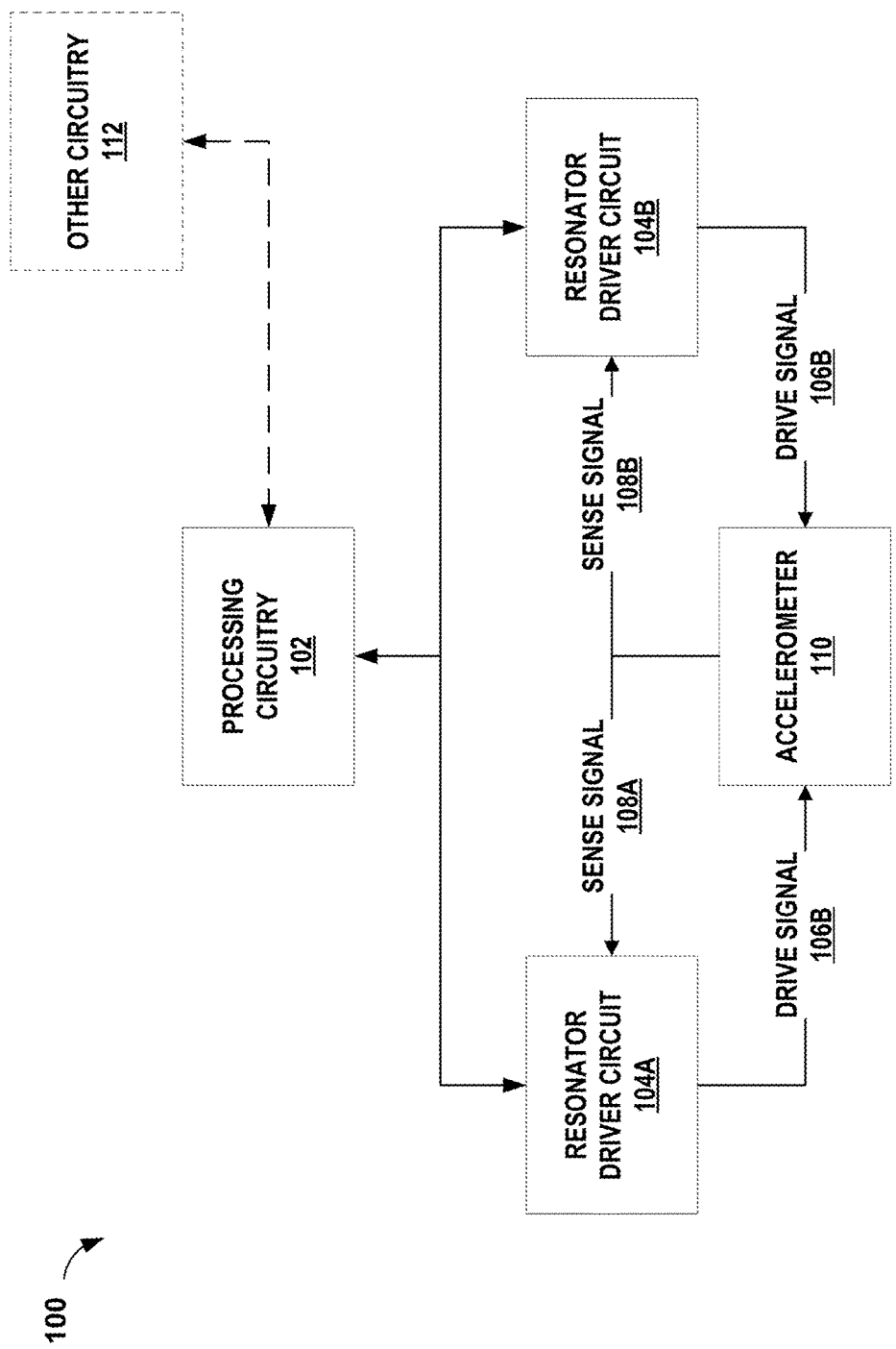
FIG. 5 is a functional block diagram illustrating a system including a pendulous VBA according to one or more techniques of this disclosure.

FIG. 5 is a functional block diagram illustrating a system including a pendulous VBA according to one or more techniques of this disclosure. The functional blocks of system 100 are just one example of a system that may include a VBA according to this disclosure. In other examples, functional blocks may be combined, or functions may be grouped in a different manner than depicted in FIG. 5. Other circuitry 112 may include power supply circuits and other processing circuits that may use the output of accelerometer 110 to perform various functions, e.g. inertial navigation and motion sensing.

System 100 may include processing circuitry 102, resonator driver circuits 104A and 104B, and accelerometer 110. Accelerometer 110 may include any VBA, including the pendulous proof mass VBA accelerometers described above in relation to FIGS. 1-4B.

In the example of FIG. 5, resonator driver circuits 104A and 104B are operatively connected to accelerometer 110 and may send drive signals 106A and 106B to accelerometer 110 as well as receive sense signals 108A and 108B from accelerometer 110. In the example of FIG. 5, resonator driver circuit 104A may be coupled to one resonator, e.g. resonator 18A depicted in FIG. 2A, and resonator driver circuit 104B may be coupled to a second resonator, e.g. resonator 18B. Resonator driver circuits 104A and 104B may be configured to output a signal that causes the resonators of accelerometer 110 to vibrate at a respective resonant frequency of each of the resonators. In some examples, vibrate means to excite and sustain mechanical motion for each resonator through electrostatic actuation. In some examples, resonator driver circuits 104A and 104B may include one or more oscillator circuits. In some examples the signal to accelerometer 110 may travel along conductive pathways along or within the support base of accelerometer, such as support base 36 described above in relation to FIGS. 2B and 4B. The signal from resonator driver circuits 104A and 104B may provide a patterned electric field to cause resonators of accelerometer 110 to maintain resonance.

Resonator driver circuit 104A may output drive signal 106A at a different frequency than drive signal 106B from resonator driver circuit 104B. The example of FIG. 5 may be configured to determine a differential frequency signal based on sense signals 108A and 108B. Resonator driver circuits 104A and 104B may adjust the output of drive signals 106A and 106B based on the feedback loop from sense signals 108A and 108B, e.g. to maintain the resonators at the respective resonant frequency. As described above, a VBA according to this disclosure may include one resonator or more than two resonators and may also include fewer or additional resonator driver circuits.

As described above in relation to FIGS. 1-4B, an acceleration of the pendulous mass VBA, e.g. in a direction substantially parallel to the plane of the proof mass, may cause a rotation of the pendulous proof mass about the hinge flexure parallel to the plane of the proof mass. The resonators of accelerometer 110 may be configured to receive a force, in response to the rotation of the proof mass, such that the force causes a respective change in resonant frequency of at least one resonator.

Processing circuitry 102 may communicate with resonator driver circuits 104A and 104B. Processing circuitry 102 may include various signal processing functions, such as filtering, amplification and analog-to-digital conversion (ADC). Filtering functions may include high-pass, band-pass, or other types of signal filtering. In some examples, resonator driver circuits 104A and 104B may also include signal processing functions, such as amplification and filtering. Processing circuitry 102 may output the processed signal received from accelerometer 110 to other circuitry 112 as an analog or digital signal. Processing circuitry 102 may also receive signals from other circuitry 112, such as command signals, calibration signals and similar signals.

Processing circuitry 102 may operatively connect to accelerometer 110, e.g. via resonator driver circuits 104A and 104B. Processing circuitry 102 may be configured to receive the signal from accelerometer 110, which may indicate of a respective change in the resonant frequency of at least one resonator of accelerometer 110. Based on the respective change in resonant frequency, processing circuitry 102 may determine an acceleration measurement. In other examples (not shown in FIG. 5), processing circuitry 102 may be part of the feedback loop from accelerometer 110 and may control the drive signals 106A and 106B to maintain the resonators at their resonant frequency.

Figure 6:
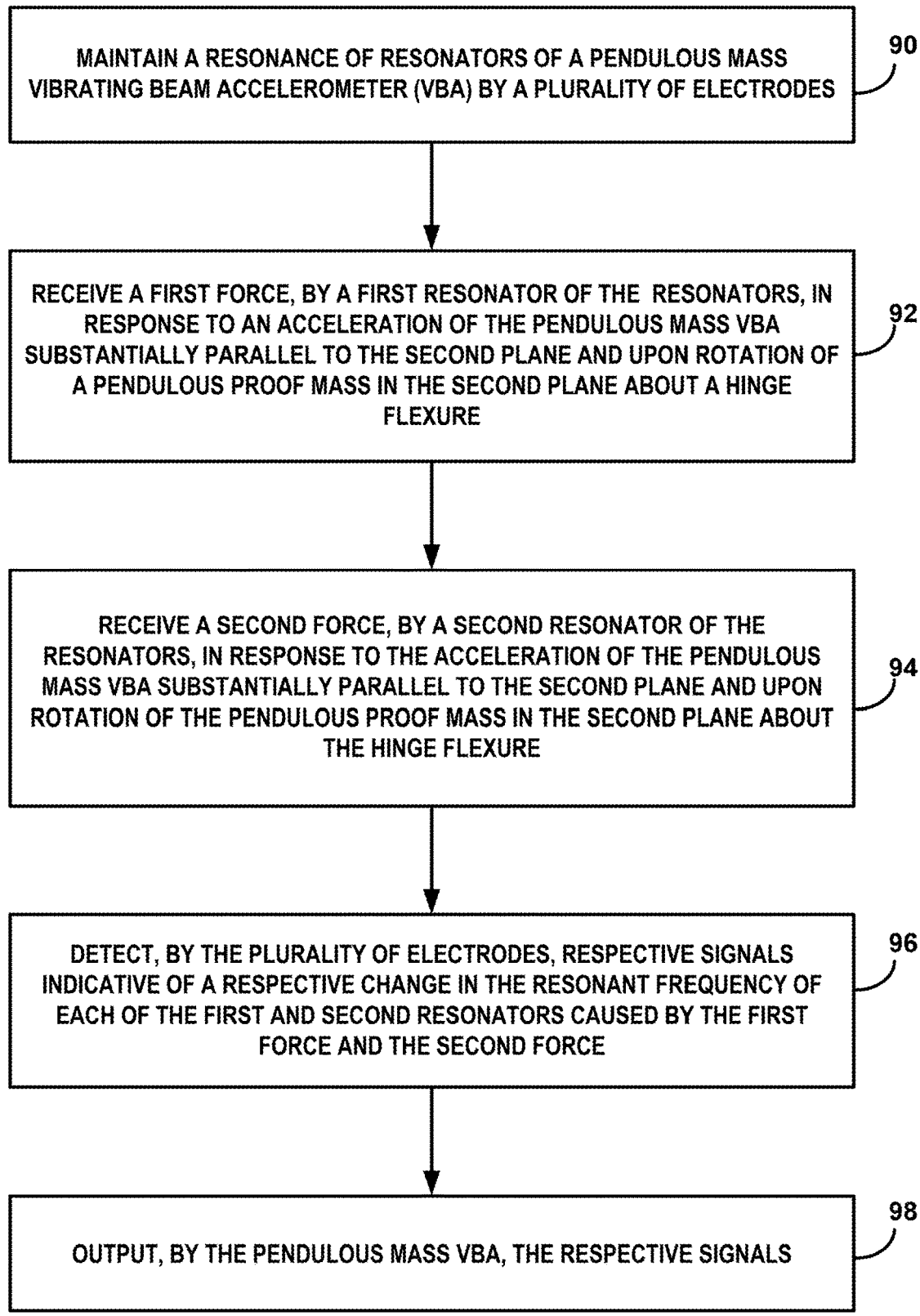
FIG. 6 is a flow diagram illustrating an example mode of operation of a VBA according to one or more techniques of this disclosure.

FIG. 6 is a flow chart illustrating an example mode of operation of a VBA according to one or more techniques of this disclosure. The steps of FIG. 6 will be described in terms of FIGS. 2A and 2B unless otherwise noted.

A VBA, such as VBA 30, may receive electrical signals that maintain a resonance of one or more resonators, such as resonators 18A and 18B. The electrical signals may travel along a plurality of electrodes, or other conductive pathways of VBA 30 (90). In some examples the electrical signals may be received by VBA 30 from a signal generation circuit, such as resonator driver circuit 104A described above in relation to FIG. 5.

In response to an acceleration on VBA 30, proof mass 32 may rotate in the X-Y plane about the center of rotation at hinge flexure 22. In some examples the acceleration of VBA 30 may be substantially parallel to the X-Y plane. The rotation of pendulous proof mass 32 may apply a force to a resonator, such as resonator 18A (92).

In response to an acceleration from a force on VBA 30, proof mass 32 may rotate in the X-Y plane about the center of rotation at hinge flexure 22. In some examples the acceleration of VBA 30 may be substantially parallel to the X-Y plane. The rotation of pendulous proof mass 32 may apply a force to a resonator, such as resonator 18A (92).

The rotation of proof mass 32 about the center of rotation at hinge flexure 22 proof mass 32 may also apply a force to a second resonator, such as resonator 18B (94). In the example of FIGS. 2A and 2B, with two resonators configured on each side of proof mass 32, the first force, e.g. on resonator 18A may be a compressive force and the second force, e.g. on resonator 18B may be a tension force.

The plurality of electrodes in VBA 30 may detect respective signals from resonators 18A and 18B that are indicative of a respective change in the resonant frequency of each resonator, which was caused by the forces on the released beams 19A and 19B of resonators 18A and 18B (96). VBA 30 may output the respective signals indicating the change in frequency, e.g. via conductive paths in support base 36, such as conductive paths 37A and 37B (98).

In one or more examples, the functions described above may be implemented in hardware, software, firmware, or any combination thereof. For example, the various components of FIG. 5, such as processing circuitry 102, other circuitry 112 and resonator driver circuits 104A and 104B may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media, such as memory 332, can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. For example, processing circuitry 102 may include a microcontroller, which may contain one or more memory storage portions.

Instructions may be executed by one or more processors, such as one or more DSPs, general purpose microprocessors, ASICs, FPGAs, or other equivalent integrated or discrete logic circuitry. Accordingly, the term "processor," as used herein, such as processing circuitry 102, may refer to any of the foregoing structure or any other structure suitable for implementation of the techniques described herein. In addition, in some aspects, the functionality described herein may be provided within dedicated hardware and/or software modules configured for encoding and decoding. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples of the disclosure have been described. These and other examples are within the scope of the following claims.

The invention claimed is:

1. A device comprising:
   a pendulous proof mass;
   a support base defining a first plane;
   a resonator connection structure mechanically connected to the support base with only a single primary anchor, wherein the resonator connection structure is in a second plane parallel to the first plane;
   a hinge flexure configured to connect the pendulous proof mass to the resonator connection structure, wherein the hinge flexure suspends the pendulous proof mass parallel to the support base at the single primary anchor, and wherein the pendulous proof mass rotates about the hinge flexure in the second plane in response to an acceleration of the device parallel to the first plane of the support base; and
   one or more resonators configured to connect the pendulous proof mass to the resonator connection structure and to flex in the second plane based on a rotation of the pendulous proof mass about the hinge flexure,
      wherein each of the one or more resonators resonate at a respective driven resonant frequency, and
      wherein the single primary anchor is configured to reduce forces applied to the support base from reaching the one or more resonators;
   wherein the pendulous proof mass, the hinge flexure, and the one or more resonators are in the second plane.

2. The device of claim 1, further comprising a support flexure coupled to the pendulous proof mass, wherein the support flexure is configured to restrict out-of-plane motion of the pendulous proof mass with respect to the second plane.

3. The device of claim 1, wherein the one or more resonators are configured to flex in a direction substantially parallel to a long axis of the resonator connection structure.

4. The device of claim 1, wherein the one or more resonators are configured to flex in a direction substantially perpendicular to a long axis of the resonator connection structure.

5. The device of claim 1, wherein each resonator of the one or more resonators comprises an anchored comb and a released beam, wherein:
   the anchored comb is in the second plane and mechanically attached to the support base in the first plane, and
   the released beam is in the second plane and mechanically attached to the resonator connection structure and mechanically attached to the pendulous proof mass.

6. The device of claim 1, wherein the resonator connection structure comprises a stiffness greater than an axial spring constant of each resonator of the one or more resonators.

7. The device of claim 1, wherein the single primary anchor is configured to allow a first thermal expansion of the support base, and a second thermal expansion of the one or more resonators and the resonator connection structure, wherein the first thermal expansion is different than the second thermal expansion.

8. The device of claim 7, wherein the resonator connection structure is configured such that the resonator connection structure prevents bias errors that result from a thermal expansion mismatch between the support base and the pendulous proof mass and the one or more resonators.

9. The device of claim 7, wherein a coefficient of thermal expansion (CTE) for each of the pendulous proof mass, the resonator connection structure, the hinge flexure, the one or more resonators and mechanical connections between the pendulous proof mass, the resonator connection structure, the hinge flexure, the one or more resonators comprise a CTE that is substantially equal.

10. The device of claim 1, wherein the resonator connection structure is configured to substantially prevent a force applied to the support base transferring to either the pendulous proof mass or the one or more resonators.

11. The device of claim 10, wherein the force applied to the support base is a twisting force.

12. The device of claim 1, wherein the one or more resonators include a first resonator receiving tension forces and a second resonator receiving compression forces.

13. The device of claim 1, wherein the one or more resonators provide a differential frequency measurement.

14. A system comprising
   a pendulous mass vibrating beam accelerometer (VBA), comprising:
      a pendulous proof mass;
      a support base defining a first plane;
      a resonator connection structure mechanically connected to the support base with only a single primary anchor, wherein the resonator connection structure is in a second plane parallel to the first plane;
      a hinge flexure configured to connect the pendulous proof mass to the resonator connection structure, wherein the hinge flexure suspends the pendulous proof mass parallel to the support base at the single primary anchor, and wherein the pendulous proof mass rotates about the hinge flexure in the second plane in response to an acceleration of the VBA parallel to the first plane of the support base; and
      one or more resonators configured to connect the pendulous proof mass to the resonator connection structure and to flex in the second plane based on a rotation of the pendulous proof mass about the hinge flexure,
         wherein each of the one or more resonators resonate at a respective resonant frequency, and
         wherein the single primary anchor is configured to reduce forces applied to the support base from reaching the one or more resonators;
      wherein the pendulous proof mass, the hinge flexure, and the one or more resonators are in the second plane
   a resonator driver circuit operatively connected to the pendulous mass VBA;
   processing circuitry operatively connected to the pendulous mass VBA via the resonator driver circuit,
   wherein:
      the resonator driver circuit is configured to output a first signal that causes the one or more resonators of the pendulous mass VBA to vibrate at the respective resonant frequency of each of the one or more resonators,
      an acceleration of the pendulous mass VBA in a direction substantially parallel to the second plane causes a rotation of the pendulous proof mass about the hinge flexure parallel to the second plane,
      the one or more resonators are configured to receive a force, in response to the rotation of the pendulous proof mass, such that the force causes a respective change in resonant frequency of the one or more resonators, and the processing circuitry is configured to receive a second signal from the pendulous mass VBA indicative of the respective change in the resonant frequency and based on the respective change in resonant frequency, determine a measurement of the acceleration of the pendulous mass VBA.

15. The system of claim 14, wherein the first signal from the resonator driver circuit is configured to vibrate the one or more resonators, wherein to vibrate comprises excite and sustain mechanical motion for the one or more resonators through electrostatic actuation.

16. A method comprising:

maintaining, by a plurality of electrodes, resonance of one or more resonators of a pendulous mass vibrating beam accelerometer (VBA), wherein the pendulous mass VBA comprises:

a pendulous proof mass;

a support base defining a first plane;

a resonator connection structure mechanically connected to the support base with only a single primary anchor, wherein the resonator connection structure is in a second plane parallel to the first plane;

a hinge flexure configured to connect the pendulous proof mass to the resonator connection structure, wherein the hinge flexure suspends the pendulous proof mass parallel to the support base at the single primary anchor, and wherein the pendulous proof mass rotates about the hinge flexure in the second plane in response to an acceleration of the pendulous mass VBA parallel to the first plane of the support base; and one or more resonators configured to connect the pendulous proof mass to the resonator connection structure and to flex in the second plane based on a rotation of the pendulous proof mass about the hinge flexure, wherein each of the one or more resonators resonate at a respective resonant frequency, wherein the pendulous proof mass, the hinge flexure, and the one or more resonators are in the second plane; and wherein the single primary anchor is configured to reduce forces applied to the support base from reaching the one or more resonators;

receiving, by a first resonator of the one or more resonators, in response to the acceleration of the pendulous mass VBA substantially parallel to the second plane and upon rotation of the pendulous proof mass in the second plane about the hinge flexure, a first force;

receiving, by a second resonator of the one or more resonators, in response to the acceleration of the pendulous mass VBA substantially parallel to the second plane and upon rotation of the pendulous proof mass in the second plane about the hinge flexure, a second force;

detecting, by the plurality of electrodes, respective signals that are indicative of a respective change in the resonant frequency of each of the first and second resonators caused by the first force and the second force; and outputting, by the pendulous mass VBA, the respective signals.

17. The method of claim 16, wherein maintaining the resonance of the one or more resonators of the accelerometer comprises receiving, by the pendulous mass VBA and from an oscillator circuit coupled to the plurality of electrodes, an electric charge such that one or more tines of the respective resonators vibrate at the resonant frequency.

18. The method of claim 16, wherein outputting the respective signals comprises outputting the respective signals to a processing circuitry, the method further comprising determining, by the processing circuitry and based on the respective signals, an acceleration measurement.

* * * * *